US006345209B1

United States Patent
Yu (12) United States Patent
(10) Patent No.: US 6,345,209 B1
(45) Date of Patent: *Feb. 5, 2002

(54) METHOD OF USING CRITICAL DIMENSION MAPPING TO QUALIFY A NEW INTEGRATED CIRCUIT MANUFACTURING PROCESS

(75) Inventor: Warren T. Yu, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/263,067

(22) Filed: Mar. 8, 1999

(51) Int. Cl.[7] ............................................... G06F 19/00
(52) U.S. Cl. ............................ 700/121; 250/492; 430/5
(58) Field of Search .......................... 700/121; 716/4; 430/22, 30, 5; 365/120; 250/492; 382/144–145; 355/53

(56) References Cited

U.S. PATENT DOCUMENTS

| 5,392,361 | A | | 2/1995 | Imaizaumi et al. | |
|---|---|---|---|---|---|
| 5,646,870 | A | * | 7/1997 | Krivokapic et al. | ............ 716/4 |
| 5,965,306 | A | * | 10/1999 | Mansfield et al. | ............. 430/22 |
| 5,985,497 | A | * | 11/1999 | Phan et al. | .................... 430/30 |
| 5,986,765 | A | * | 11/1999 | Nakasuji | ...................... 356/399 |
| 6,044,007 | A | * | 3/2000 | Capodieci | .................... 365/120 |
| 6,115,108 | A | * | 9/2000 | Capodieci | ..................... 355/77 |
| 6,215,127 | B1 | * | 4/2001 | Yu | .............................. 250/492 |

OTHER PUBLICATIONS

S. Wolf and R.N. Tauber, Silicon Processing for the VLSI Era, vol. 1—Process Technology, pp. 446–455.

* cited by examiner

Primary Examiner—William Grant
Assistant Examiner—Ronald D Hartman, Jr.

(57) ABSTRACT

In order to improve the quality of a semiconductor product, mapping of the critical dimension of predetermined features such as ring oscillators, test transistors, turning forks WET transistors etc., is carried out at various stages of the process. For example, a reticle is mapped, the etch mask which is produced from the effect of the image on the resist layer, and the results of the etching are respectively mapped. Using the data gleaned from these mappings, the stage or operation of a new manufacturing process is adjusted to improve the quality of the end product. Thus, when a new manufacturing process is introduced into production, it is possible to run the process and then work back via the collected critical dimension data to determined what changes in the settings of a manufacturing process, etching process, resist formulation or the like, are appropriate in order to improve the fabrication result.

7 Claims, 5 Drawing Sheets

FIG. 1

FIG. 2 POLY GATE CD MAP FEATURE LOCATION

FIG. 4  CD MAP DATA SUMMARY

| TYPE | ORIEN | TARGET | STAT | K6_1 | K6_2 | K6_3 | K6_4 | MEAN | STD | RANGE |
|---|---|---|---|---|---|---|---|---|---|---|
| TR | HOR | DENSE | MEAN | 0.21274 | 0.21298 | 0.21496 | 0.21052 | 0.21280 | .0039807 | 0.0142 |
| TR | HOR | DENSE | STD | 0.00361 | 0.00514 | 0.00303 | 0.00378 | 0.21280 | .0039807 | 0.0142 |
| TR | HOR | DENSE | RANGE | 0.00810 | 0.01240 | 0.00810 | 0.00990 | 0.21280 | .0039807 | 0.0142 |
| TR | HOR | DENSO | MEAN | 0.21962 | 0.21680 | 0.21582 | 0.21038 | 0.21566 | .0053242 | 0.0166 |
| TR | HOR | DENSO | STD | 0.00549 | 0.00306 | 0.00563 | 0.00271 | 0.21566 | .0053242 | 0.0166 |
| TR | HOR | DENSO | RANGE | 0.01190 | 0.00720 | 0.01420 | 0.00590 | 0.21566 | .0053242 | 0.0166 |
| TR | HOR | ISO | MEAN | 0.21834 | 0.21326 | 0.21666 | 0.21508 | 0.21584 | .0044297 | 0.0170 |
| TR | HOR | ISO | STD | 0.00357 | 0.00532 | 0.00354 | 0.00467 | 0.21584 | .0044297 | 0.0170 |
| TR | HOR | ISO | RANGE | 0.00850 | 0.01380 | 0.00980 | 0.01180 | 0.21584 | .0044297 | 0.0170 |
| TR | VER | DENSO | MEAN | 0.21926 | 0.21058 | 0.21338 | 0.21244 | 0.21392 | .0051935 | 0.0164 |
| TR | VER | DENSO | STD | 0.00358 | 0.00277 | 0.00515 | 0.00533 | 0.21392 | .0051939 | 0.0164 |
| TR | VER | DENSO | RANGE | 0.00820 | 0.00710 | 0.01290 | 0.01400 | 0.21392 | .0051935 | 0.0164 |

| TYPE | ORIEN | TARGET | STAT | K6_1 | K6_2 | K6_3 | K6_4 | MEAN | STD | RANGE |
|---|---|---|---|---|---|---|---|---|---|---|
| RINGOS | HOR | DENSE | MEAN | 0.21318 | 0.21008 | 0.21106 | 0.21074 | 0.21127 | .0032030 | 0.0144 |
| RINGOS | HOR | DENSE | STD | 0.00233 | 0.00250 | 0.00541 | 0.00105 | 0.21127 | .0032030 | 0.0144 |
| RINGOS | HOR | DENSE | RANGE | 0.00530 | 0.00690 | 0.01440 | 0.00210 | 0.21127 | .0032030 | 0.0144 |
| RINGOS | HOR | DENSO | MEAN | 0.21158 | 0.20790 | 0.20924 | 0.20658 | 0.20883 | .0047685 | 0.0155 |
| RINGOS | HOR | DENSO | STD | 0.00518 | 0.00218 | 0.00526 | 0.00563 | 0.20883 | .0047685 | 0.0155 |
| RINGOS | HOR | DENSO | RANGE | 0.01330 | 0.00590 | 0.01180 | 0.01470 | 0.20883 | .0047685 | 0.0155 |
| RINGOS | HOR | ISO | MEAN | 0.21224 | 0.20728 | 0.20934 | 0.21076 | 0.20991 | .0048506 | 0.0145 |
| RINGOS | HOR | ISO | STD | 0.00365 | 0.00620 | 0.00541 | 0.00373 | 0.20991 | .0048506 | 0.0145 |
| RINGOS | HOR | ISO | RANGE | 0.00980 | 0.01450 | 0.01130 | 0.00980 | 0.20991 | .0048506 | 0.0145 |

| TYPE | ORIEN | TARGET | STAT | C | LL | MEANS | UL | UR | MEAN | STD | RANGE |
|---|---|---|---|---|---|---|---|---|---|---|---|
| WET | VER | DENSO | MEAN | 0.20245 | 0.20570 | LR 0.21142 | 0.21062 | 0.20808 | 0.20720 | .0042157 | 0.0106 |
| WET | VER | DENSO | STD | 0.00546 | 0.00374 | 0.00617 | | 0.00298 | 0.00485 | | |
| WET | VER | DENSO | RANGE | 0.01560 | 0.00980 | 0.01750 | | 0.00860 | 0.01150 | | |

| TYPE | ORIEN | TARGET | STAT | MEAN | STD | RANGE |
|---|---|---|---|---|---|---|
| TF | VER | DENSO | MEAN | 0.20697 | .0053506 | 0.0244 |
| TF | VER | DENSO | STD | 0.20697 | .0053506 | 0.0244 |
| TF | VER | DENSO | RANGE | 0.20607 | .0053506 | 0.0244 |

FIG. 5 POLY GATE FICD MAP

METHOD OF USING CRITICAL DIMENSION MAPPING TO QUALIFY A NEW INTEGRATED CIRCUIT MANUFACTURING PROCESS

BACKGROUND OF THE INVENTION

1. Field of the Invention

The present invention relates generally to techniques which are used during the fabrication of semiconductor devices. More specifically, the invention relates to a technique which uses multiple mappings of critical dimensions of selected features formed on a wafer during the process of forming integrated circuits, to enable a new fabrication/manufacturing process to be calibrated/qualified in an efficient manner and with particular regard to mitigating effects which are encountered during the various steps which are carried during the various constructive processes which constitute the new process as a whole.

2. Description of the Related Art

When a new process, which should be understood throughout the following disclosure to mean at least the combination of a number of different processes including resist coating, exposure via a reticle/photolithographic operation or electron beam scanning, etch/implantation mask formation, etching or implantation etc., at least one of which are used during the fabrication process, is introduced to a production facility, a great deal of work/set up is required to ensure that the operation of a stepper and associated robotics and transport mechanisms are appropriately calibrated, the etch mixtures/recipes are tuned to the required levels to avoid under or over etching, undercutting and the like. For example, calibration or qualifying of the stepper is necessary before production can begin. It is also necessary to calibrate the operation of the wafer track and associated robotics in order to determine that the wafer is being moved between and disposed in the stepper and processing chambers (e.g. etching chambers) in an optimally correct manner, and thus assure that the wafer is reproducibly set on the table of the stepper in a correctly oriented and located position, each and every time.

Further, during the fabrication of an integrated circuit (IC) it is necessary to impress images on resist coating and to etch, deposit, implant or the like, a number of times before the devices on the wafer are completed and the wafer is ready for dicing. It is, therefore, necessary to ensure that hardware, which is used to move the wafer(s) back and forth, manipulate and to photolithograph, is operating in a manner wherein each and every wafer undergoes the same manipulations/operations during each and every stage of production. For example, accurate reproducible location of the wafer in the stepper is necessary. U.S. Pat. No. 5,392,361 issued on Feb. 21, 1998 in the name of Imaizumi et al., discloses the use of a mark on the wafer and a mark position detecting method and apparatus which uses fuzzy logic to improve alignment accuracy.

For further examples of the type of arrangements which are associated with the tool set, reference can be had to U.S. Pat. No. 4,641,071 issued in February 1987 in the name of Tazawa et al, and U.S. Pat. No. 4,719,357 issued in January 1998 in the name of Ayata et al.

It is also necessary to ensure that all of the other processes which are conducted during the IC fabrication are also working in "concert" with the hardware and the computer/numerical controls which are associated therewith. Feedback arrangements which monitor the temperature of the surface of the wafer during plasma etching, for example, should it be used during the fabrication, is preferably checked to see if the parameter is being accurately detected and reported.

With respect to the etching process which inevitably form part of the manufacturing process, reference may be had to U.S. Pat. No. 3,909,325 issued on Sep. 30, 1975 to Church et al. which discloses an example of wet etching that uses a combination of potassium hydroxide, ethylene glycol and water. This reference is hereby incorporated herein by reference. For an example of plasma etching, reference may be had to U.S. Pat. No. 4,115,184 which was issued on Sep. 19, 1978 in the name of Poulsen. The content of this document is also incorporated herein by reference.

However, no matter what measures are taken, in the final analysis, the only way of determining if all of the necessary adjustments have in fact been made in an optimal manner, is to make a test run and to examine the end product (viz., conduct empirical testing). However, this technique tends to leave it to chance as to which adjustment or setting needs to be fine timed in order to bring this highly complex arrangement into truly optimal operational status. That is to say, the setting and arrangement of the reticle which is set in the optics of the stepper must be carefully examined in order to determine if adjustments to this vital piece of apparatus is necessary to correct some less than desirable outcome of the IC production.

The present invention, therefore, provides a type of feedback approach. For example, an adjustment to the stepper operation, the robotics which move the wafers from the wafer track to the stepper table, the position to which the wafer track moves the wafers prior transfer, in combination with a possible change in the reticle or even an resist or etching recipe, may, even though it would appear contrary to what might be conventionally considered to be correct and/or appropriate, enable the end result to be improved. Nevertheless, without some form of sophisticated analysis which can be carried out in a reliable and reproducible manner, these types of adjustment and changes in technique amount to nothing more than guess work.

Accordingly, there exists a need for a reliable technique by which a new manufacturing process can be introduced and qualified in a manner which identifies the problems which require correction in order to achieve set-up quickly and relatively inexpensively.

SUMMARY OF THE INVENTION

The present invention provides a technique wherein a type of feedback control, based on accumulated critical dimension (CD) mapping data of a suitably large number of different features which are produced in an integrated circuit (IC) arrangement, is implemented in a manner that enables the calibration or qualification of a new manufacturing process. More specifically, the underlying inventive technique is based on a sequence of mappings which are carried out at each of a select number of production stages/steps, and wherein critical dimension (CD) data, accumulated during each of the mappings, is examined, compared and used to determine adjustments to be made at various stages of the manufacture to ensure that the closest possible adherence to the design requirements is achieved.

The present invention, therefore, enables generation of a feedback control data base. For example, if the mapping of results of the etching are examined and it is found that a line width or corner is too great or too small, or the configurations of given features are not as good as is required to assure the best performance of the device (e.g., features necessary to optimize the speed performance of a microprocessor for example), then it is possible to determine what adjustments can/should be made to the various pieces of apparatus and/or processes which are involved in the manufacturing process so as to influence the processes at each of the stages which are involved in the process, and to instigate changes/ adjustments which will enable improvements to be made and for a better product to be realized.

In particular, the present invention enables the qualifying or calibrating of a new manufacturing process be to checked/ modified so as to achieve the best possible results prior to actually beginning production. Once the operation of the stepper and associated apparatus, such as a wafer track, is modified/adjusted and its performance is assured, and the etching and the like type of operations which are carried out, are determined to be appropriately tuned, the amount of mapping which is used during actual production runs can be reduced to a level which is necessary to determine that the process is running properly and that a new reticle or etch recipe (for example) is functioning optimally.

More specifically, a first aspect of the present invention resides in a method of qualifying a fabrication process used in connection with the fabrication of integrated circuits, the method comprising the steps of: mapping the critical dimensions of a predetermined plurality of features at each of a plurality of selected exposure fields of at least one of a predetermined number of production stages or steps of a wafer on which a plurality of integrated circuits are fabricated; comparing the data collected at each of the mappings; and determining, from the comparison, what changes are required in a set-up of a predetermined piece of apparatus or process which is used in at least one of a plurality of production stages, to bring at least one critical dimension of at least one of the predetermined features into agreement with at least one of a predetermined set of design critical dimensions.

In this method the predetermined features comprise ring oscillators, turning forks, test transistors, and wafer electrical testing-purpose (WET) transistor.

A second aspect of the invention resides in a method of qualifying a fabrication process used in the production of integrated circuits, the method comprising the steps of: exposing a predetermined number of exposure fields on the wafer using one of a photolithographic technique or an electron beam technique; developing and mapping critical dimension of all features that impact integrated circuit speed performance, including ring oscillators, turning forks, test transistors, and WET transistors, which are located in the exposure field, and which are contained in a selected group of the predetermined number of exposure fields, at least two different stages of production; comparing the mapped critical dimension with a set of corresponding prerequisite critical dimension values; and adjusting an operation at least at one of the two different stages of production in order to bring the critical dimension which are derived using the mapping into accordance with a difference between the mapped critical dimension and the prerequisite critical dimension values.

Another aspect of the invention resides in a method of qualifying a manufacturing process used in the production of integrated circuitry, the manufacturing process including the use of a stepper, a wafer track and robotic apparatus for selectively moving a wafer between at least the stepper and a reaction chamber and for reproducibly locating the wafer in each of same, the method comprising the steps of: mapping predetermined features of a reticle which is included in the stepper, to determine a first set of critical dimension data; mounting the reticle in a stepper and operating the stepper to move the substrate into a predetermined series of positions with respect to the reticle; impressing an image produced by the reticle onto a layer of photo resist formed on the wafer at each of the predetermined series of positions to form a corresponding plurality of exposure fields; removing the portion of the photo resist effected by the image impression to develop a photo resist mask pattern; mapping the predetermined features as they are formed in the photo resist mask pattern for each of selected exposure fields selected from among the plurality of exposure fields, to determine a second predetermined set of critical dimension data for the pattern; etching the wafer through the photo resist mask pattern; removing at least one portion of the photo resist mask pattern to reveal an etched pattern formed in the wafer; mapping the predetermined features in the etched pattern corresponding to each of the selected exposure fields and recording a third set of critical dimension data; repeating the steps of impressing, removing, mapping, etching, removing and mapping, in at least one subsequent fabrication stage; comparing the first, and at least one of the second and third sets of critical dimension data with each other and/or a predetermined set of standard critical dimension data values; and determining an adjustment to at least one step of the process which is required to reduce a difference between the third set of critical dimension data and the predetermined set of critical dimension data.

In accordance with this method the step of mapping comprises mapping a predetermined plurality of exposure fields which are clustered at a center portion of the wafer. In an embodiment the predetermined plurality of exposure fields is five, and the predetermined features comprise ring oscillators, turning forks, test transistors, and WET transistors.

BRIEF DESCRIPTION OF THE DRAWINGS

The various aspects and advantages of the present invention will become better understood as a description of the preferred embodiments is given with reference to the appended drawings in which.

DETAILED DESCRIPTION OF THE PREFERRED EMBODIMENTS

Figure 1:
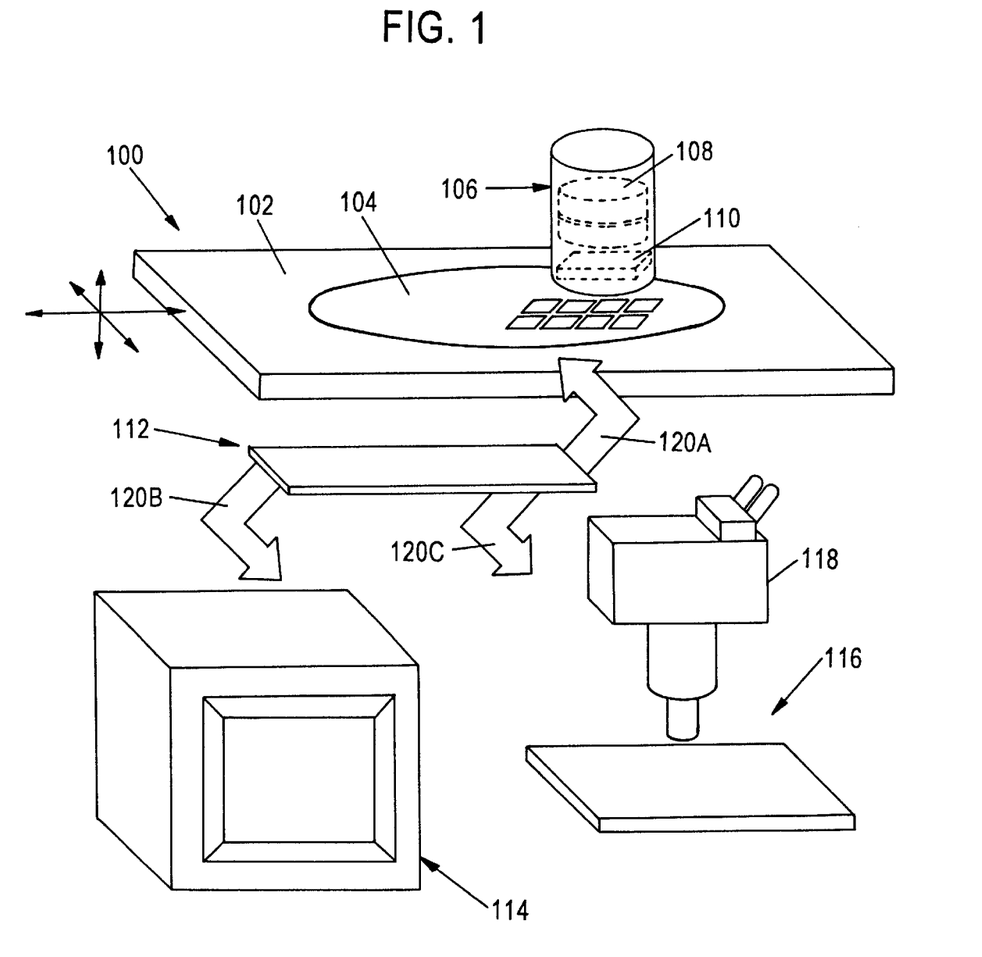
FIG. 1 is a schematic perspective view of a stepper, wafer track, reaction/process chamber, and scanning station, wherein the stepper includes an optical system in which a reticle is mounted and a moveable table on which a wafer is carried.

FIG. 1 schematically shows a stepper 100 which includes a table 102 adapted to support and hold wafers 104 thereon, and an optical system 106 which includes a source of radiant energy 108 and a reticle 110 for determining the pattern which is imprinted on the wafer. A wafer track which is use to move the wafers to and from the stepper, is denoted by the numeral 112. In this figure, the wafer track 112 is shown as being arranged to transport the wafer 104 between the stepper 100, a processing unit 114 in which etching (for example) can be carried out, and a mapping station 116 in which the features which are formed, can be measured via an electron microscope or the like device 118. Robotics which are associated with the wafer track and which are used to move the wafers from one device to another are designated by the numerals 120A, 120B and 120C.

As will be appreciated, this view is highly schematic and omits all but the outlines of the basic elements of the stepper 100, wafer track 112, processing unit or chamber 114, mapping station 116 and robotics 120A–120C. Further, only a limited number of chip outlines are shown on the wafer 104 and the overall arrangement is not drawn to scale nor is intended to accurately represent the actual structures of the respective devices. For further details pertaining to the construction, control and operation of steppers reference may be had to U.S. Pat. No. 5,392,361 issued on Feb. 21, 1995 in the name of Imaizumi et al. For details pertaining to wafer tracks and associated apparatus, reference may be had to U.S. Pat. No. 5,685,588 issued to Wong et al. on Nov. 11, 1997.

In accordance with the present invention, before the stepper 100 is used to imprint the image which is produced by the reticle 110, repeatedly and sequentially over the surface of a resist covered wafer 104, a predetermined number of key features which are present on the reticle, are mapped and a first set of data is obtained.

Figure 2:
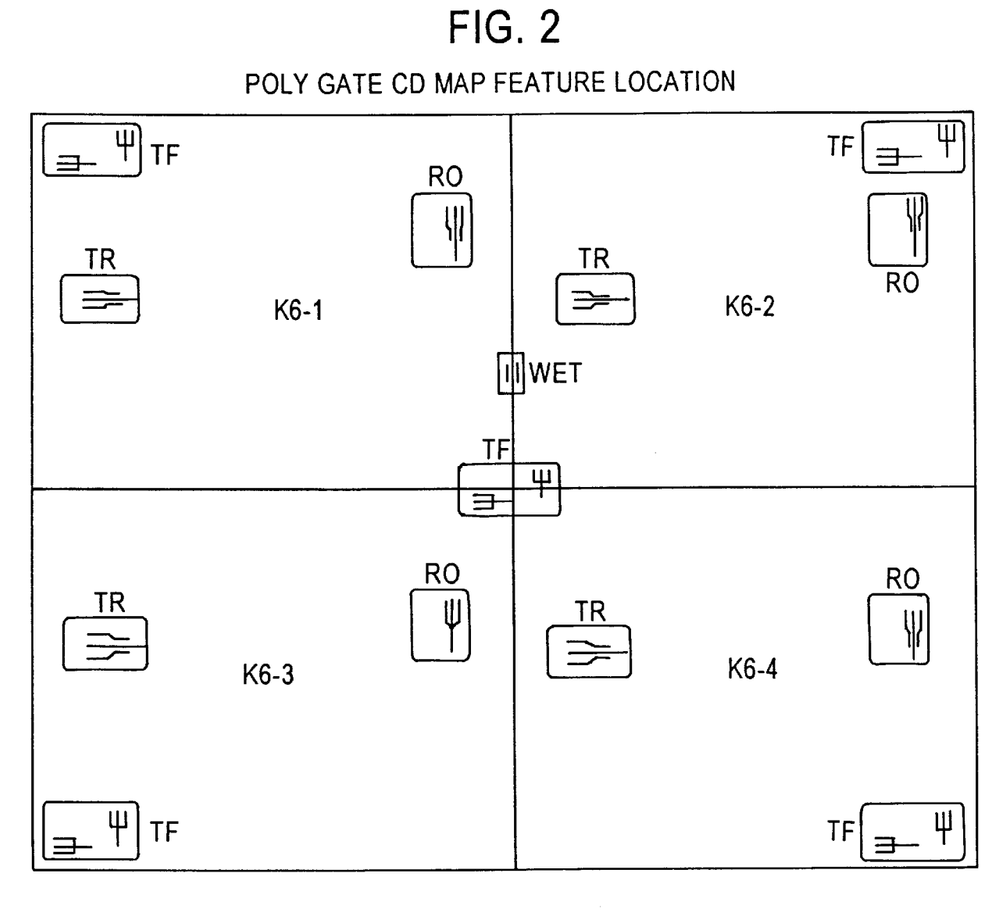
FIG. 2 is an enlarged view of an exposure field showing the features which are mapped in accordance with the present invention.

FIG. 2 shows an example of the locations of the multiple features which are mapped in accordance with the present invention. As will be appreciated from this figure, a tuning fork feature TF is located at each of the four corners of the exposure field. A fifth tuning fork feature TF is formed at the center of the field at a location wherein the four quadrants K6-1, K6-2, K6-3 and K6-4 of the field, interse another. Each of these features has a horizontal element and a vertical element.

In addition to the above mentioned elements, four ring oscillators RO and four test transistors TR are located in the illustrated locations. In this illustration, a single WET transistor spans the boarder of the K6-1 and K6-2 quadrants of the exposure field. It will be understood from the following data that the test transistors, which are subjected to measurement in accordance with the present invention, have both vertical and horizontal elements which are subject to CD measurement.

Table I below clarifies the element/function relationship which exists in accordance with a preferred embodiment of the invention.

TABLE I

Poly Gate C.D. Map Features and Functions

| Feature | | | Function |
|---|---|---|---|
| (1) Ring Oscillator Horizontal (R) | DENSE DENSO ISO | K6 1/2/3/4 K6 1/2/3/4 K6 1/2/3/4 | Directly Impacting Speed Performance and Sort Yield |
| (2) Tuning Fork Vertical (TF) | DENSO, C (CENTER) DENSO, LL (LOWER LEFT) DENSO, LR (LOWER RIGHT) DENSO, UL (UPPER LEFT) DENSO, UR (UPPER RIGHT) | | No Electrical Value, For Measurement of Stepper Lens Field CD Control Uniformity Only |
| (3) Test Transistor Horizontal (TR) Vertical | DENSE DENSO ISO DENSO | K6 1/2/3/4 K6 1/2/3/4 K6 1/2/3/4 K6 1/2/3/4 | Directly Impacting Speed Performance and Sort Yield |
| (4) WET Transistor Vertical (WET) | DENSO | | For Process Electrical Evaluation Only (Electrical CDs) |

Figure 3:
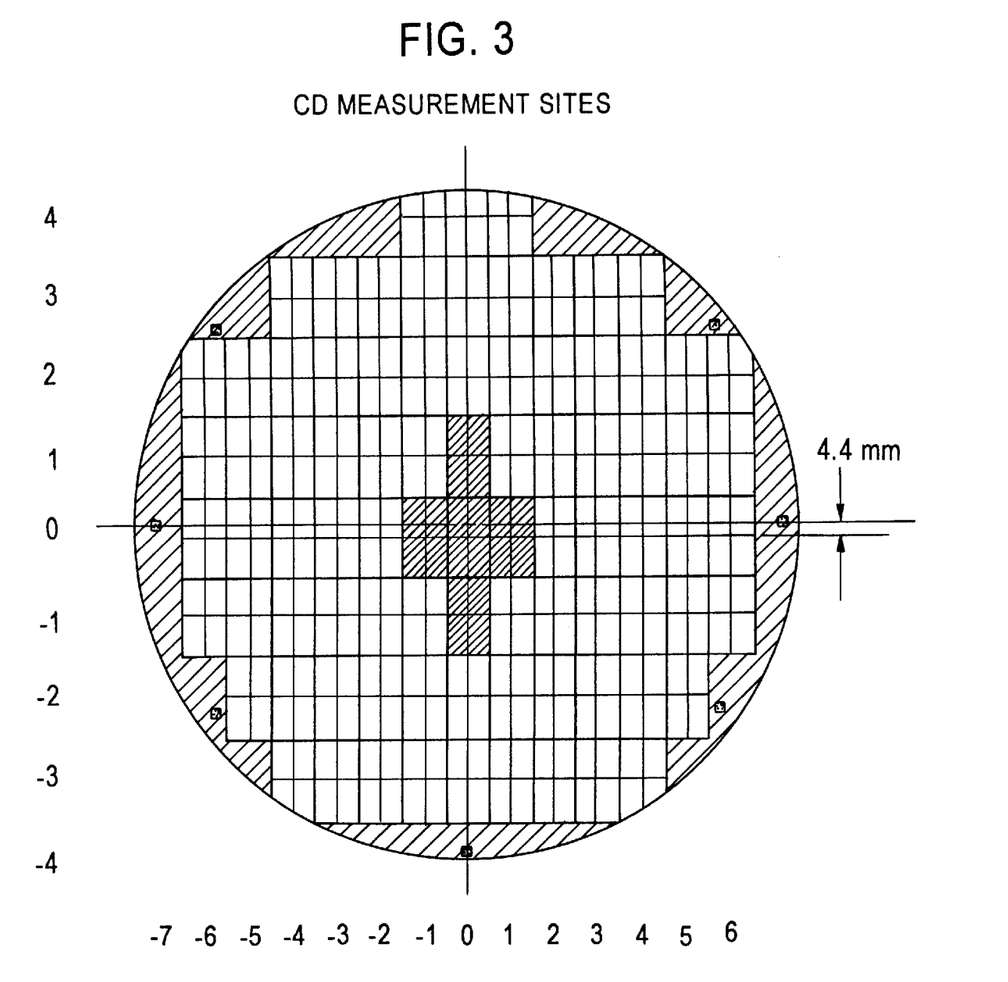
FIG. 3 is a plan view of a wafer showing the positions of the exposure fields in which mapping according to the present invention is carried out.

The mapping according to an embodiment of the invention is carried out on the cluster of five center exposure fields which are shown in fine hatching at the center of the wafer 104 in FIG. 3.

Figure 4:
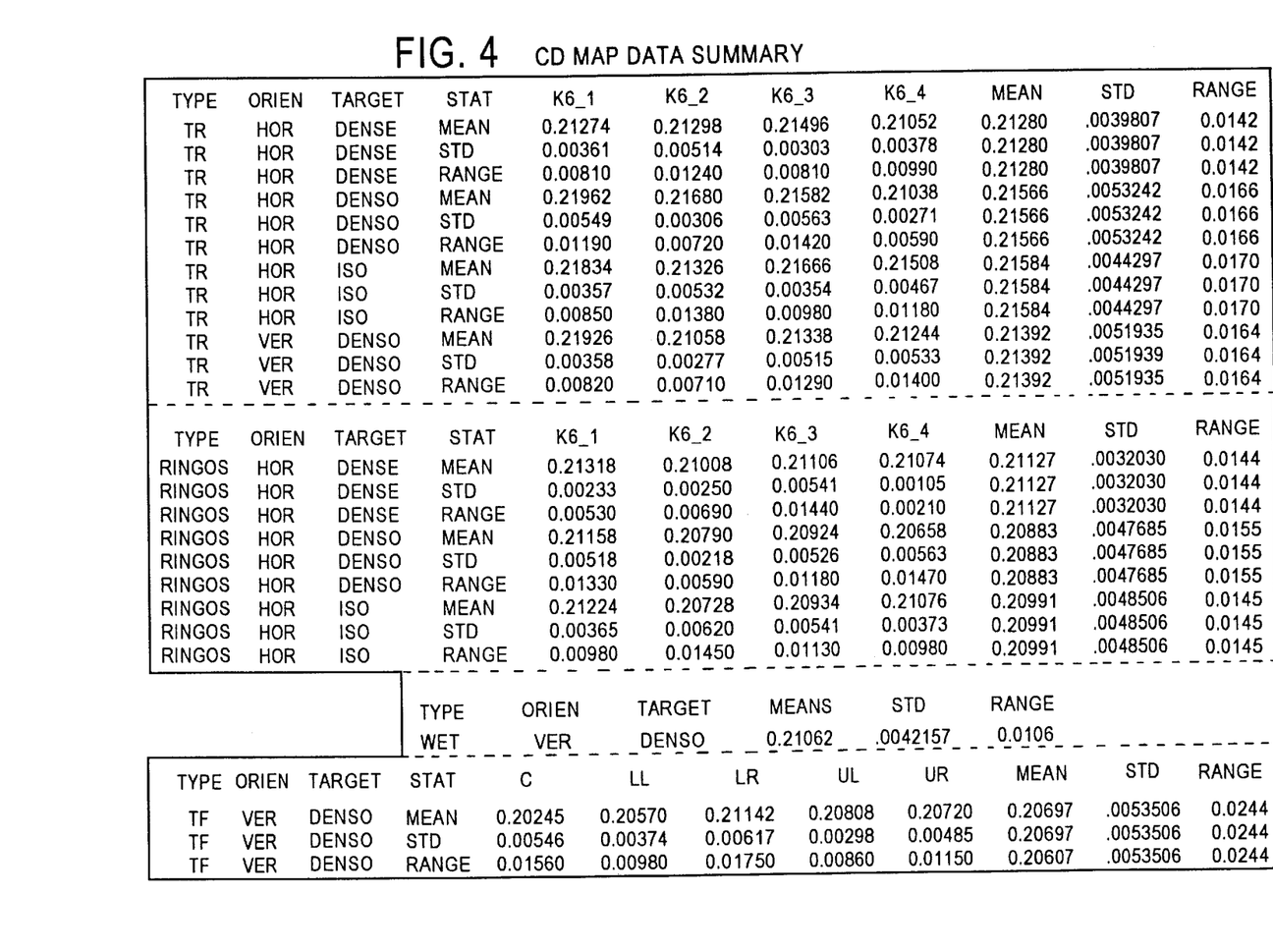
FIG. 4 is a table showing the results which are graphed in FIG. 4.
Figure 5:
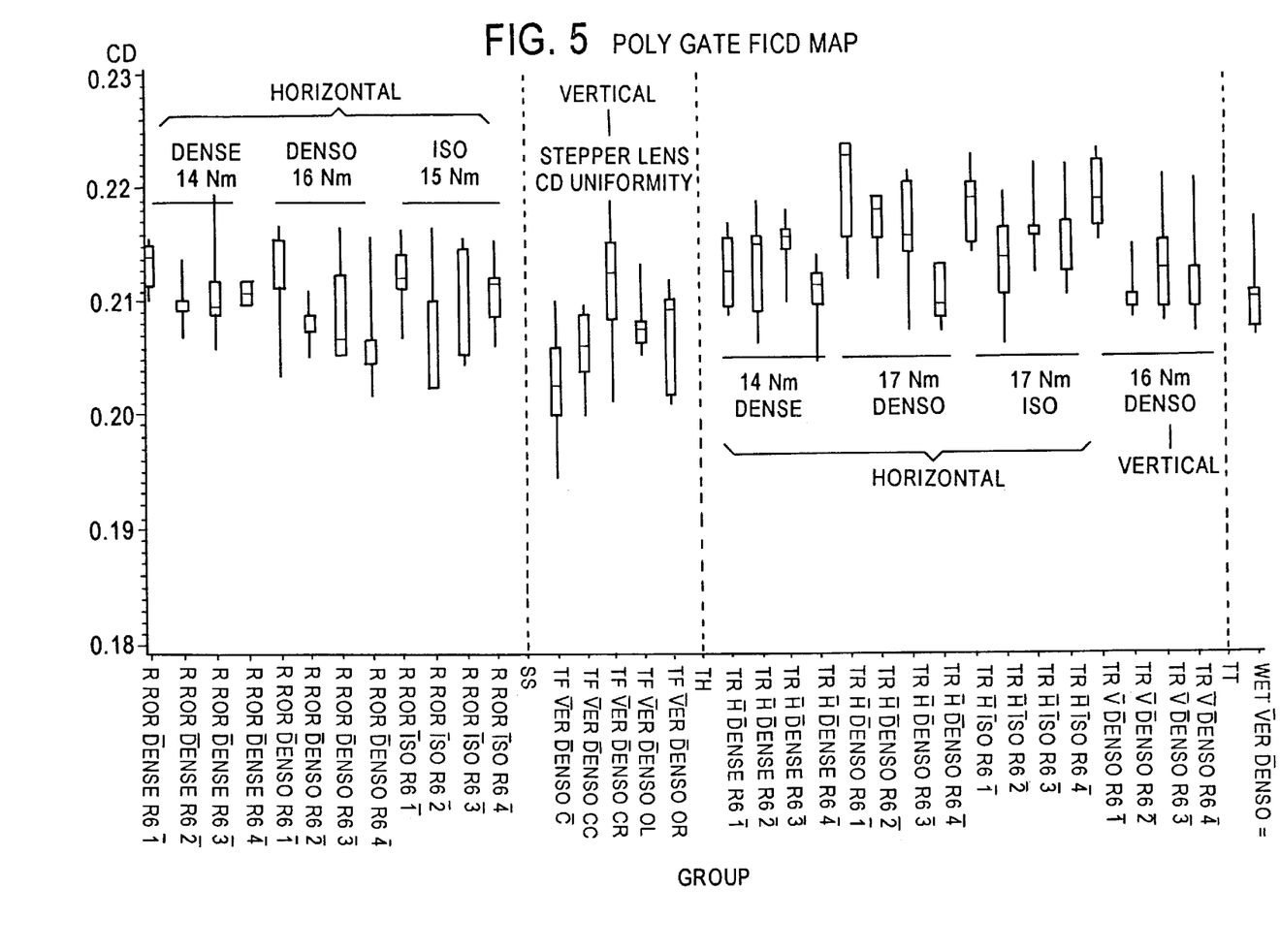
FIG. 5 is a graph showing an example of the results derived using the mapping technique.

FIG. 4 shows an example of the data which is collected using a mapping which is carried out in accordance with the present invention while FIG. 5 shows this data in graphical form.

Embodiments of the present invention include optimizing by conducting more than one mapping to determine the best effect/modification which can be made to the manufacturing process which is being qualified or calibrated in preparation for production. That is to say, the effect of an etching step, for example, which is carried out between the imprinting of the image on the resist layer and the final mapping which is carried out, can have a significant effect as to modifications to the positioning operations that are carried out by the stepper which should be made to rectify the process and to ensure that the CDs of the final product are as close to the design specifications as possible.

Accordingly, after the CD data for the features listed in the above table are measured via a mapping of the reticle at the mapping station 116, the reticle 110 is set in the stepper 100 and a photo resist covered wafer is sequentially imprinted to form a plurality of exposure fields. Following this, the wafer 104 is transferred to the reaction chamber 114, wherein portions of the resist layer are removed to reveal the etch mask. The wafer 104 is then removed and the CDs of the same features which were mapped on the reticle, are again mapped at the mapping station 116 and the data recorded along with that for the reticle.

The wafer 104 is then moved back along the wafer track 114 to the reaction chamber 114 wherein etching is carried out. This etching can take the form of dry etching, wet etching, plasma etching or the like. The etching mask is then removed by a well known technique such as by dissolution or by oxidation. Inasmuch as each of these process are very well known in the IC fabrication art, further explanation of this stage will be omitted for brevity.

The etched wafer 104 is then removed from the chamber 114 and transported back to the mapping station 116 whereat each of the features which have been previously mapped are again mapped This data is then stored.

This process of coating the upper surface of the wafer with resist, exposing surface to form a plurality of exposure fields, the removal of portions of the resist to form an etch or implantation mask, the mapping of the further features which have been formed in the mask and the subsequent etching (for example) and the mapping of the same, can be carried one or more times while collecting pertinent data at each of the mappings.

The three sets of data are then compared to determine if the process is proceeding in a manner which is satisfactory and that the final product, i.e. the etched wafer is being produced with the features in such a condition that the speed performance and the like of the device, which is being constructed using the above mentioned steps, will be as good as desired. This comparison can reveal a great deal of information and provide guidance as to how to adjust one or more stages of the process to improve the end result. However, while the resist recipe, the etch recipe/parameters, the operation of the stepper and or wafer track, can have a profound influence on the IC which is produced, it is the effect that the settings of the combination of all of these processes/devices which is the center of attention in this instance.

It is deemed essentially self-evident to the person skilled in the art of producing IC circuits, once having been provided with the above disclosure, how the multiple mapping of the invention can be used to show how the process proceeds and what feedback adjustments need to be made to the various pieces of apparatus and/or processes which individually add up to the manufacturing process as a whole, in order to achieved the desired end. Examples of the manner in which the above type of data can be interpreted and used, is given in U.S. Pat. No. 5,646,870, issued on Jul. 8, 1997, in the name of Krivokapic et al. This reference deals with process simulation and statistical analysis of CD values. The content of this reference is hereby incorporated herein by reference thereto.

It will be further appreciated that while only a photolithic process which utilizes visible or UV light and an reticle has been disclosed and described in the specification and drawings, it is possible that this technique can be replaced with an electron beam imprinting technique or the like, if so desired and that this falls within the basic purview of the invention which is limited only by the appended claims.

More specifically, in the case wherein data is gathered via the mapping of poly gate CD for a new or modified integrated circuit manufacturing process, if the collected data show any of the biases between iso/dense/denso and vertical/horizontal features (see table 1 and FIG. 5) are greater than 20 nm the process is not qualified until the requirements are met. The optimization of the process can be made through reticle CD with OPC (Optical Proximity Correction), stepper partial coherence adjustment and etch recipe change.

Only the preferred embodiments of the present invention and but a few examples of its versatility are shown and described in the present disclosure. However, it is to be understood that the present invention is capable of use in various other combinations and environments and is capable of changes or modifications with the scope of the inventive concept expressed herein.

What is claimed is:

1. A method of qualifying a manufacturing process used in the production of integrated circuitry, said manufacturing process including the use of a stepper, a wafer track, and robotic apparatus for selectively moving a wafer between at least the stepper and a reaction chamber and for reproducibly locating the wafer in each of same, the method comprising the steps of:

mapping predetermined features of a reticle, which is included in the stepper, to determine a first set of critical dimension data;

mounting the reticle in a stepper and operating the stepper to move the substrate into a predetermined series of positions with respect to the reticle;

impressing an image produced by the reticle onto a layer of photo resist formed on the wafer at each of the predetermined series of positions to form a corresponding plurality of exposure fields;

removing the portion of the photo resist effected by the image impression to develop a photo resist mask pattern;

mapping the predetermined features as they are formed in the photo resist mask pattern for each of selected exposure fields, selected from among the plurality of exposure fields, to determine a second set of critical dimension data for the pattern;

etching the wafer through the photo resist mask pattern;

removing at least one portion of the photo resist mask pattern to reveal an etched pattern formed in the wafer;

mapping the predetermined features in the etched pattern corresponding to each of the selected exposure fields and recording a third set of critical dimension data;

repeating the steps of impressing, removing, mapping, etching, removing and mapping, in at least one subsequent fabrication stage;

comparing the first, and at least one of the second and third sets of critical dimension data with each other and/or a predetermined set of standard critical dimension data values; and determining an adjustment to at least one step of the process which is required to reduce a difference between the third set of critical dimension data and the predetermined set of critical dimension data.

2. The method as set forth in claim 1, wherein the step of mapping comprises mapping a predetermined plurality of exposure fields which are clustered at a center portion of the wafer.

3. The method as set forth in claim 2, wherein the predetermined plurality of exposure fields is five.

4. The method as set forth in claim 1, wherein the predetermined features comprise ring oscillators, turning forks, test transistors, and wafer electrical testing-purpose (WET) transistors.

5. A method of qualifying a fabrication process used in connection with the fabrication of integrated circuits, the method comprising the steps of:

mapping the critical dimensions of a predetermined plurality of features on an element to obtain a first set of critical dimension data, the element being used in forming the predetermined plurality of features on the integrated circuits at one of a predetermined number of production stages;

using the element in a first processing of the integrated circuits to form the predetermined plurality of features on said integrated circuits and then mapping the critical dimension of said predetermined plurality of features to obtain a second set of critical dimension data;

performing a second processing of the integrated circuits and then mapping the critical dimension of all said predetermined plurality of features on said wafer to obtain a third set of critical dimension data;

comparing the first, second and third sets of critical dimension data and a predetermined set of standard critical dimension data values; and determining, from the comparison, what changes are required in a set-up of a predetermined piece of apparatus or process which is used in at least one of the plurality of production stages, to bring at least one critical dimension of at least one of the predetermined features into agreement with at least one of a predetermined set of design critical dimensions.

6. The method as set forth in claim 5, wherein the predetermined plurality of microprocessor features comprise ring oscillators, turning forks, test transistors, and wafer electrical testing-purpose (WET) transistors.

7. A method of qualifying a fabrication process used in connection with the fabrication of integrated circuits, the method comprising the steps of:

mapping predetermined features of an element used in the fabrication process to obtain a first set of critical dimension data, the predetermined features including ring oscillators, turning forks, test transistors, and wafer electrical testing-purpose (WET) transistors;

using said element in a first production stage of fabricating the integrated circuits and then mapping the predetermined features to obtain a second set of critical dimensional data;

obtaining a third set of critical dimension data by subjecting the integrated circuits to a second production stage, after the first production stage, and then mapping the predetermined features;

comparing the first set of critical dimension data with at least one of the second and third sets of critical dimension data; and using a result of the step of comparing to determine an adjustment to at least one step of the fabrication process to reduce a difference between the third set of critical dimension data and a predetermined set of critical dimension data.

* * * * *

UNITED STATES PATENT AND TRADEMARK OFFICE
CERTIFICATE OF CORRECTION

PATENT NO. : 6,345,209 B1
DATED : February 5, 2002
INVENTOR(S) : Warren T. Yu

It is certified that error appears in the above-identified patent and that said Letters Patent is hereby corrected as shown below:

<u>Column 10,</u>
Line 9, change "dimensional data" to -- dimension data --.

Signed and Sealed this

Twenty-eighth Day of May, 2002

*Attest:*

JAMES E. ROGAN
*Attesting Officer*     *Director of the United States Patent and Trademark Office*